(12) United States Patent
Pyun et al.

(10) Patent No.: US 10,923,074 B2
(45) Date of Patent: Feb. 16, 2021

(54) RECEIVING CIRCUIT WITH OFFSET VOLTAGE COMPENSATION

(71) Applicant: SAMSUNG DISPLAY CO., LTD., Yongin-si (KR)

(72) Inventors: Kihyun Pyun, Gwangmyeong-si (KR); Seung-woon Shin, Asan-si (KR); Eui-myeong Cho, Anyang-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 154 days.

(21) Appl. No.: 16/354,358

(22) Filed: Mar. 15, 2019

(65) Prior Publication Data

US 2019/0325843 A1  Oct. 24, 2019

(30) Foreign Application Priority Data

Apr. 24, 2018  (KR) ........................ 10-2018-0047530

(51) Int. Cl.
*G09G 5/00*  (2006.01)
*H03L 7/08*  (2006.01)
(Continued)

(52) U.S. Cl.
CPC ......... *G09G 5/008* (2013.01); *H03F 3/45179* (2013.01); *H03H 11/04* (2013.01);
(Continued)

(58) Field of Classification Search
CPC ........... G09G 5/008; G09G 2310/0275; G09G 2310/0267; G09G 2310/08;
(Continued)

(56) References Cited

U.S. PATENT DOCUMENTS 9,812,090 B2    11/2017  Lim et al.
2006/0132233 A1*  6/2006  Woo ................... H03F 3/45475
                                                      330/251
(Continued)

FOREIGN PATENT DOCUMENTS

JP          2003084857      3/2003
KR           100731740      6/2007
KR         1020160145901   12/2016

*Primary Examiner* — Kent W Chang
*Assistant Examiner* — Andrew Lee
(74) *Attorney, Agent, or Firm* — F. Chau & Associates, LLC

(57) ABSTRACT

A receiving circuit includes a first capacitor connected to a first signal line, a second capacitor connected to a second signal line. A first bias control circuit may convert a common mode voltage of a first received signal provided through the first capacitor to a first voltage level to output a first biased signal. A second bias control circuit may convert a common mode voltage of a second received signal provided through the second capacitor to a second voltage level to output a second biased signal. A balance compensation circuit may receive the first biased signal and the second biased signal, compensate for an offset voltage of the first biased signal based on the second biased signal, and compensate for an offset voltage of the second biased signal based on the first biased signal to output a first differential signal and a second differential signal.

20 Claims, 11 Drawing Sheets

(51) Int. Cl.
*H03F 3/45* (2006.01)
*H03H 11/04* (2006.01)

(52) U.S. Cl.
CPC ... *H03L 7/0807* (2013.01); *G09G 2300/0426* (2013.01); *G09G 2310/0267* (2013.01); *G09G 2310/0275* (2013.01); *G09G 2310/08* (2013.01); *H03F 2203/45022* (2013.01); *H03F 2203/45156* (2013.01)

(58) Field of Classification Search
CPC ............ G09G 2300/0426; G09G 3/20; G09G 3/3275; G09G 3/3688; G09G 2370/14; G09G 2370/08; H03H 11/04; H03F 3/45179; H03F 3/45183; H03F 2203/45156; H03F 2203/45318; H03F 2203/45022; H03L 7/099; H03L 7/0807
See application file for complete search history.

(56) References Cited

U.S. PATENT DOCUMENTS

| | | | |
|---|---|---|---|
| 2008/0150930 A1* | 6/2008 | Nam | G09G 3/3696 345/212 |
| 2017/0310105 A1* | 10/2017 | Shen | H02M 7/483 |
| 2017/0339325 A1 | 11/2017 | Dabral et al. | |

\* cited by examiner (COMPARATIVE EXAMPLE)

RECEIVING CIRCUIT WITH OFFSET VOLTAGE COMPENSATION

CROSS-REFERENCE TO RELATED APPLICATION

This U.S. non-provisional patent application claims priority under 35 U.S.C. § 119 from Korean Patent Application No. 10-2018-0047530, filed on Apr. 24, 2018, which is incorporated by reference herein in its entirety.

Technical Field

The present disclosure relates to a data signal receiving circuit, and in particular, a differential signal receiving circuit, and a display device with source driver including the same.

Discussion of the Related Art

In general, a display device includes a display panel displaying an image, a timing controller driving the display panel, a source driver, and a gate driver. The display panel includes gate lines, data lines, and pixels. The source driver applies data signals to the data lines, and the gate driver applies gate signals to the gate lines. The timing controller controls the data driver and the source driver.

The display device displays the image by applying the gate signal having a "gate-on" voltage level to a predetermined gate line using the gate driver and synchronously applying the data signal corresponding to an image signal to the data lines using the source driver.

The timing controller and the source driver are connected to each other through signal paths. To allow signals transmitted from the timing controller to be stably recovered by the source driver, a common mode voltage level of the signals transmitted from the timing controller is matched with a common mode voltage level of a signal processing circuit of the source driver. A common mode voltage level may be higher for relatively high data transmission rates. Thus, there is a growing need to increase the common mode voltage level of the signals transmitted from the timing controller due to an increase in a data transmission rate for larger sized display panels.

SUMMARY

The present disclosure provides a display device with a source driver including a receiving circuit capable of stably receiving a signal.

Embodiments of the inventive concept provide a receiving circuit including a first capacitor connected to a first signal line and a second capacitor connected to a second signal line. A first bias control circuit may convert a common mode voltage of a first received signal provided through the first capacitor to a first voltage level to output a first biased signal. A second bias control circuit may convert a common mode voltage of a second received signal provided through the second capacitor to a second voltage level to output a second biased signal. A balance compensation circuit may receive the first biased signal and the second biased signal, compensate for an offset voltage of the first biased signal using the second biased signal, and compensate for an offset voltage of the second biased signal using the first biased signal to output a first differential signal and a second differential signal.

In various embodiments:

The balance compensation circuit may include a first filter circuit removing a high-frequency component from the first biased signal to output a first filtered signal, a second filter circuit removing a high-frequency component from the second biased signal to output a second filtered signal, and an amplifier receiving the first biased signal and the second filtered signal as a first input signal, receiving the second biased signal and the first filtered signal as a second input signal, and outputting the first differential signal and the second differential signal.

The amplifier may include a first resistor connected between a source voltage and a second output terminal, a second resistor connected between the source voltage and a first output terminal, a first transistor including a first electrode connected to the second output terminal, a second electrode connected to a bias node, and a gate electrode receiving the first biased signal, a second transistor including a first electrode connected to the first output terminal, a second electrode connected to the bias node, and a gate electrode receiving the first filtered signal, a third transistor including a first electrode connected to the second output terminal, a second electrode connected to the bias node, and a gate electrode receiving the second filtered signal, a fourth transistor including a first electrode connected to the first output terminal, a second electrode connected to the bias node, and a gate electrode receiving the second biased signal, and a fifth transistor including a first electrode connected to the bias node, a second electrode connected to a reference ground, and a gate electrode receiving a bias signal.

Each of the first filter circuit and the second filter circuit may include a low pass filter.

The first filter circuit may include a first filter resistor connected between a first node receiving the first biased signal and a second node and a first filter capacitor connected between the second node and the reference ground.

Each of the first filter circuit and the second filter circuit may change an operation characteristic thereof in response to a resistance selection signal and a capacitance selection signal.

The first filter circuit may include a plurality of filtering resistors having different resistances from each other, a plurality of capacitors having different capacitances from each other, a first switching circuit connecting one filtering resistor among the filtering resistors between the first node receiving the first biased signal and the second node in response to the resistance selection signal, and a second switching circuit connecting one capacitor among the capacitors between the second node and the reference ground in response to the capacitance selection signal.

The first bias control circuit may select the first voltage level in response to a bias control signal and the second bias control circuit may select the second voltage level in response to the bias control signal.

The first voltage level may be substantially the same as the second voltage level.

The receiving circuit may further include a clock and data recovery circuit to recover a clock signal and a data signal based on the first differential signal and the second differential signal.

Embodiments of the inventive concept provide a receiver including a receiving circuit converting a first received signal and a second received signal to a first differential signal and a second differential signal, respectively, a clock and data recovery circuit restoring a clock signal and a data signal based on the first differential signal and the second differential signal, and a coupling selection circuit applying a first signal and a second signal provided, respectively, through a first signal line and a second signal line to the receiving circuit or applying the first signal and the second signal to the clock and data recovery circuit as the first differential signal and the second differential signal, respectively, in response to a coupling control signal. The receiving circuit includes a first capacitor connected to the first signal line through the coupling selection circuit, a second capacitor connected to the second signal line through the coupling selection circuit, a first bias control circuit converting a common mode voltage of the first received signal provided through the first capacitor to a first voltage level to output a first biased signal, a second bias control circuit converting a common mode voltage of the second received signal provided through the second capacitor to a second voltage level to output a second biased signal, and a balance compensation circuit receiving the first biased signal and the second biased signal, compensating for an offset voltage of the first biased signal using the second biased signal, and compensating for an offset voltage of the second biased signal using the first biased signal to output the first differential signal and the second differential signal.

In an embodiment of the inventive concept, the coupling selection circuit includes first and second switching elements respectively and selectively connecting the first signal line and the second signal line to the first capacitor and the second capacitor in response to the coupling control signal and third and fourth switching elements applying the first signal of the first signal line and the second signal of the second signal line to the clock and data recovery circuit as the first differential signal and the second differential signal in response to the coupling control signal.

Embodiments of the inventive concept provide a display device including a display panel including a plurality of gate lines, a plurality of data lines, and a plurality of pixels, each being connected to a corresponding gate line among the gate lines and a corresponding data line among the date lines, a gate driver driving the gate lines, a source driver driving the data lines, and a timing controller controlling the gate driver and the source driver in response to a control signal and an image input signal provided from an outside thereof, converting the input image signal to first and second transmission signals, and transmitting the first and second transmission signals to the source driver through first and second signal lines. The source driver includes a first capacitor connected to the first signal line, a second capacitor connected to the second signal line, a first bias control circuit converting a common mode voltage of a first received signal provided through the first capacitor to a first voltage level to output a first biased signal, a second bias control circuit converting a common mode voltage of a second received signal provided through the second capacitor to a second voltage level to output a second biased signal, and a balance compensation circuit receiving the first biased signal and the second biased signal, compensating for an offset voltage of the first biased signal using the second biased signal, and compensating for an offset voltage of the second biased signal using the first biased signal to output a first differential signal and a second differential signal.

According to the above, the receiving circuit may stably receive the signals even though the common mode voltage level of the signals provided from the timing controller is different from the common mode voltage level of the signal processing circuit of the source driver.

In addition, the receiving circuit may be operated in either a DC coupling mode or an AC coupling mode in accordance with the common mode voltage level of the signals provided from the timing controller.

BRIEF DESCRIPTION OF THE DRAWINGS

The above and other aspects of the present disclosure will become readily apparent by reference to the following detailed description when considered in conjunction with the accompanying drawings, in which like reference characters indicate like elements or features, wherein.

DETAILED DESCRIPTION

Hereinafter, exemplary embodiments of the present disclosure will be described in detail with reference to the accompanying drawings. However, the present disclosure may be variously modified and realized in many different forms, and thus the present disclosure should not be construed as limited to the illustrated embodiments. Rather, these embodiments are provided as examples so that this disclosure will be thorough and complete and will fully convey the aspects and features of the present disclosure to those skilled in the art.

Figure 1:
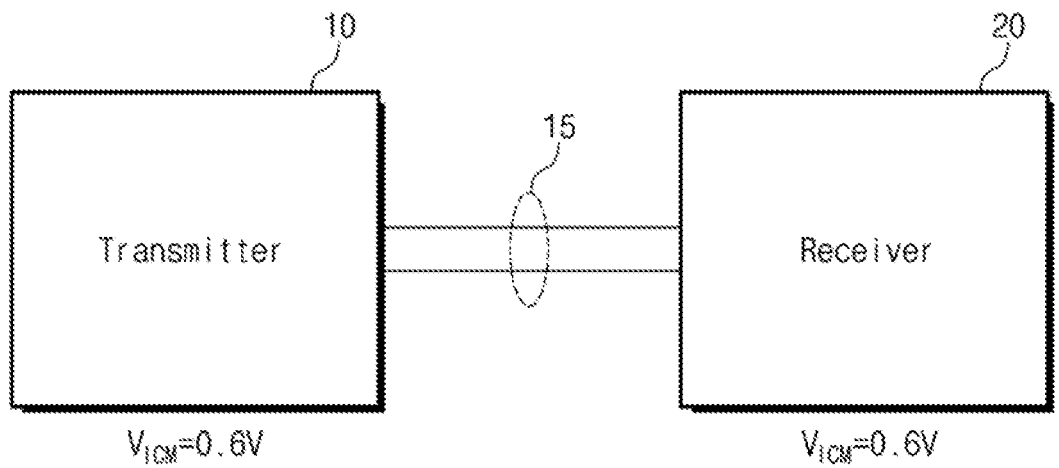
FIG. 1 schematically depicts a general connection between a transmitter and a receiver, for illustrating a balanced common mode voltage environment.

FIG. 1 schematically depicts a general connection between a transmitter 10 and a receiver 20, for illustrating a balanced common mode voltage environment. Transmitter 10 and receiver 20 are electrically connected to each other through a signal path 15. An interface between the transmitter 10 and the receiver 20 may be a high speed serial interface, such as a universal serial interface (USI), a mobile industry processor interface (MIDI), a mobile display digital interface (MDDI), an inter-integrated circuit ($I^2C$), etc.

As an example, the signal path 15 corresponds to a serial interface path to transmit differential signals between the transmitter 10 and the receiver 20. The transmitter 10 transmits a pair of differential signals, which are DC biased by a common mode voltage $V_{ICM}$, to the receiver 20 through the signal path 15. The common mode voltage $V_{ICM}$ is an average voltage level of the pair of differential signals. In general, a common mode voltage occurs when there is a voltage difference between ground systems at the transmitting and receiving ends of the signal path 15.

In FIG. 1, when the common mode voltage $V_{ICM}$ of the signals transmitted from the transmitter 10 is set to about 0.6 volts and the common mode voltage $V_{ICM}$ of the receiver 20 is set to about 0.6 volts, the receiver 20 may normally sense and recover a received signal.

Figure 2:
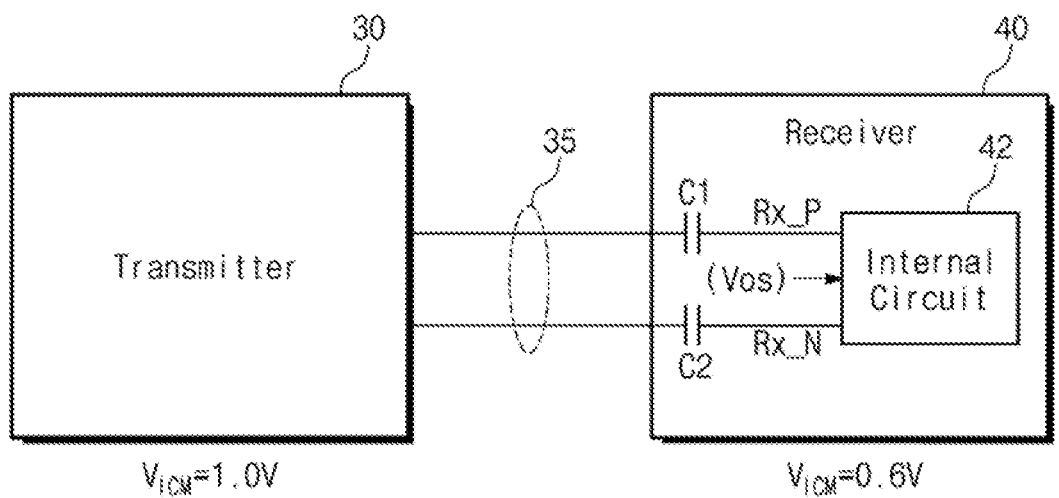
FIG. 2 schematically illustrates a serial data communication system with capacitive coupling between a transmitter and a receiver according to comparative example.

FIG. 2 schematically illustrates a serial data communication system with capacitive coupling between a transmitter 30 and a receiver 40, according to comparative example. Here, a common mode voltage $V_{ICM}$ of signals transmitted from the transmitter 30 is about 1.0 volts and the common mode voltage $V_{ICM}$ of the receiver 40 is about 0.6 volts. If the signal transmitted from the transmitter 30 were to be directly applied to an internal circuit 42, the internal circuit 42 may be damaged since a voltage level of the signal applied to the internal circuit 42 is higher than an input signal range of the internal circuit 42.

The receiver 40 includes a first capacitor C1 connected between a first signal line L1 and the internal circuit 42 and a second capacitor C2 connected between a second signal line L2 and the internal circuit 42. The first capacitor C1 and the second capacitor C2 may remove a DC bias voltage of the signals transmitted from the transmitter 30 and applied to the internal circuit 42 in the receiver 40. That is, a common mode voltage $V_{ICM}$ of a first received signal Rx_P and a second received signal Rx_N applied to the internal circuit 42 through the first capacitor C1 and the second capacitor C2 drops to a ground voltage GND level. Then, the internal circuit 42 raises the common mode voltage $V_{ICM}$ of the received signals to a desired level (e.g., about 0.6 volts) to recover the received signals with their original signal information.

As described above, although the common mode voltage $V_{ICM}$ of the signals transmitted from the transmitter 30 is different from the common mode voltage $V_{ICM}$ of the receiver 40, the receiver 40 may recover the original signal information from the first received signal Rx_P and the second received signal Rx_N, from which the DC bias voltage is removed. However, this technique is prone to errors when the common mode voltage varies or ramps due to varying bit patterns or long strings of 1's or 0's, as explained in connection with FIG. 3.

Figure 3:
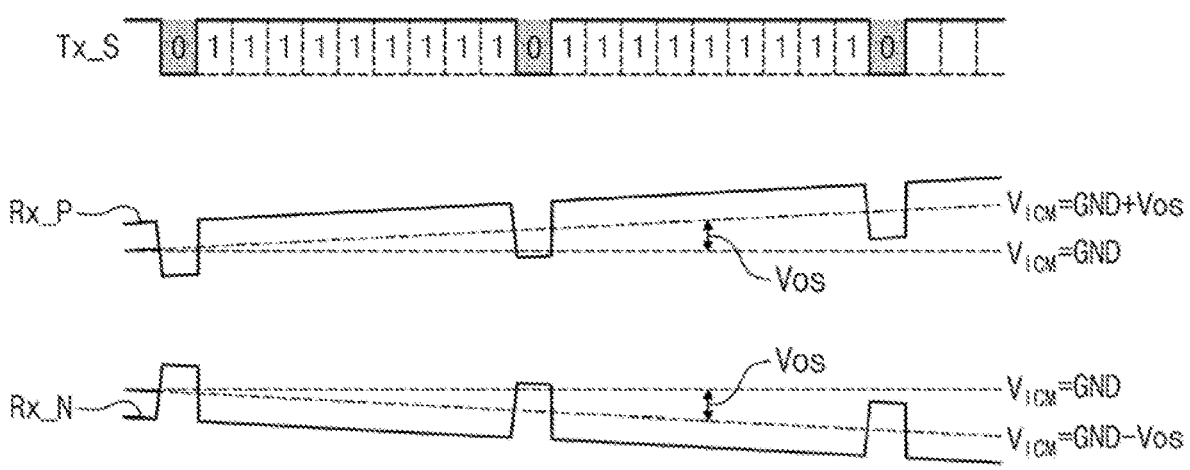
FIG. 3 is a signal diagram showing variations of received signals when the transmitter is capacitively coupled to the receiver.

FIG. 3 is a signal diagram showing variations of the received signals when the transmitter 30 of FIG. 2 is capacitively coupled to the receiver 40. Referring to FIGS. 2 and 3, the transmitter 30 converts a transmission signal Tx_S (depicted as a data signal) to a pair of differential signals (not shown) and transmits the differential signals to the receiver 40 through the signal path 35. A characteristic impedance of the signal path 35 and the first and second capacitors C1 and C2 varies depending on a frequency of the transmission signal Tx_S and a pattern (e.g., the number of high-level signals and the number of low-level signals) of the transmission signal Tx_S. When the frequency of the transmission signal Tx_S is fixed, an offset voltage Vos of the first received signal Rx_P and the second received signal Rx_N, which are applied to the internal circuit 42, may vary depending on the 1's and 0's pattern of the transmission signal Tx_S.

In the example of FIG. 3, when the transmission signal Tx_S includes a bit sequence with mainly high-level signals (e.g., logic '1'), a level of the offset voltage Vos of the first received signal Rx_P, which is a positive signal, increases as time elapses. Accordingly, the common mode voltage $V_{ICM}$ of the first received signal Rx_P increases by the offset voltage Vos ($V_{ICM}$=GND+Vos). Meanwhile, the common mode voltage. $V_{ICM}$ of the second received signal Rx_N, which is a negative signal, decreases by the offset voltage Vos ($V_{ICM}$=GND−Vos). As a result of this common mode voltage variation between the first received signal Rx_P and the second received signal Rx_N, the internal circuit 42 that recovers the signal based on the difference between the first received signal Rx_P and the second received signal may malfunction. Consequently, bit errors may occur on the receive side.

For instance, in a case that the receiver 40 is provided in the source driver of a display device, the transmission signal Tx_S may be an image signal. When the image signal to be displayed is a white color, the transmission signal Tx_S may include a series of many high-level signals (i.e., logic '1'), leading to a ramping positive offset voltage. When the image signal to be displayed is a black color, the transmission signal Tx_S may include a series of many low-level signals (i.e., logic '0'). Due to the offset voltages, the receiver 40 that consecutively receives the image signal having the specific level may not stably recover the signal to its original signal levels, Which leads to erroneous information recovery.

Figure 4:
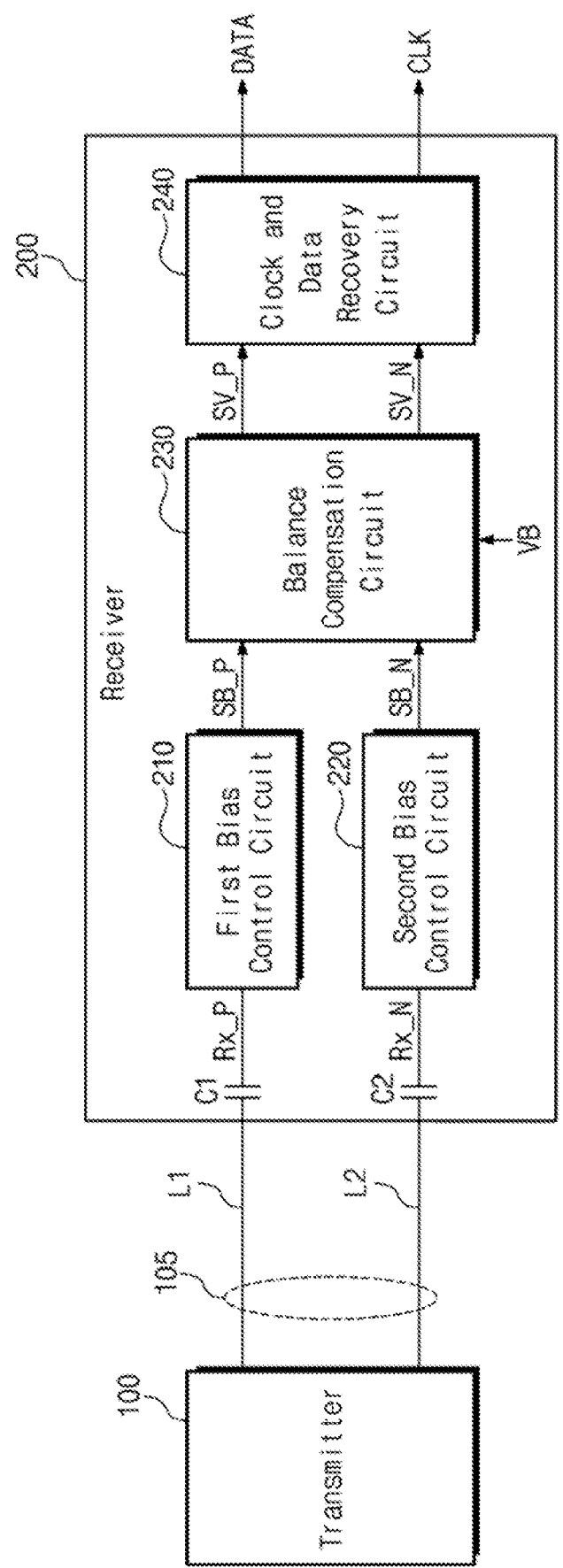
FIG. 4 is a block diagram showing a configuration of a receiver according to an exemplary embodiment of the present disclosure.

FIG. 4 is a block diagram showing a configuration of a receiver, 200, according to an exemplary embodiment of the present disclosure. Receiver 200 is connected to a transmitter 100 through a signal path 105. The signal path 105 includes a first signal line L1 and a second signal line L2. Receiver 200 includes a first capacitor C1, a second capacitor C2, a first bias control circuit 210, a second bias control circuit 220, a balance compensation circuit 230, and a clock and data recovery circuit 240.

One end of the first capacitor C1 is connected to the first signal line L1 of the signal path 105, and an opposite end is connected to the first bias control circuit 210. One end of the second capacitor C2 is connected to the second signal line L2 of the signal path 105 while an opposite end is connected to the second bias control circuit 220. Capacitive coupling circuits, such as the first capacitor C1 and the second capacitor C2, are coupled between the external circuit, i.e., the transmitter 100, and data recovery circuitry of receiver 200. The capacitive coupling circuits partially prevent the receiver 200 from being influenced by a DC bias voltage from the transmitter 100. The first capacitor C1 and the second capacitor C2 are operated as a high pass filter to remove low frequency components included in the signals received from the transmitter 100.

The first bias control circuit 210 increases a voltage level of the first received signal Rx_P received through the first capacitor C1 by a predetermined DC bias voltage to output a first biased signal SB_P (Herein, a "biased signal" refers to a signal with a level that has been changed due to the influence of another bias voltage.) The second bias control circuit 220 increases a voltage level of the second received signal Rx_N received through the second capacitor C2 by a predetermined DC bias voltage to output a second biased signal SB_N.

In receiver 200, the DC bias voltage set in each of the first bias control circuit 210 and the second bias control circuit 220 may be determined depending on a common mode voltage $V_{ICM}$ set in the clock and data recovery circuit 240. As an example, when the common mode voltage $V_{ICM}$ set in the clock and data recovery circuit 240 is about 0.6 volts, the first bias control circuit 210 increases the voltage level of the first received signal Rx_P by about 0.6 volts, and the second bias control circuit 220 increases the voltage level of the second received signal Rx_N by about 0.6 volts.

In an embodiment, the DC bias voltage set in each of the first bias control circuit 210 and the second bias control circuit 220 may have the same fixed voltage level. In another embodiment, the DC bias voltage set in each of the first bias control circuit 210 and the second bias control circuit 220 may have a voltage level that is variable corresponding to a control signal provided from an outside source.

The balance compensation circuit 230 receives the first biased signal SB_P and the second biased signal SB_N and outputs a first differential signal SV_P and a second differential signal SV_N. The balance compensation circuit 230 compensates for the offset voltage of the first biased signal SB_P using the second biased signal SB_N and compensates for the offset voltage of the second biased signal SB_N using the first biased signal SB_P to output the first differential signal SV_P and the second differential signal SV_N.

The clock and data recovery circuit 240 recovers a clock signal CLK and a data signal DATA based on the first differential signal SV_P and the second differential signal SV_N.

Figure 5:
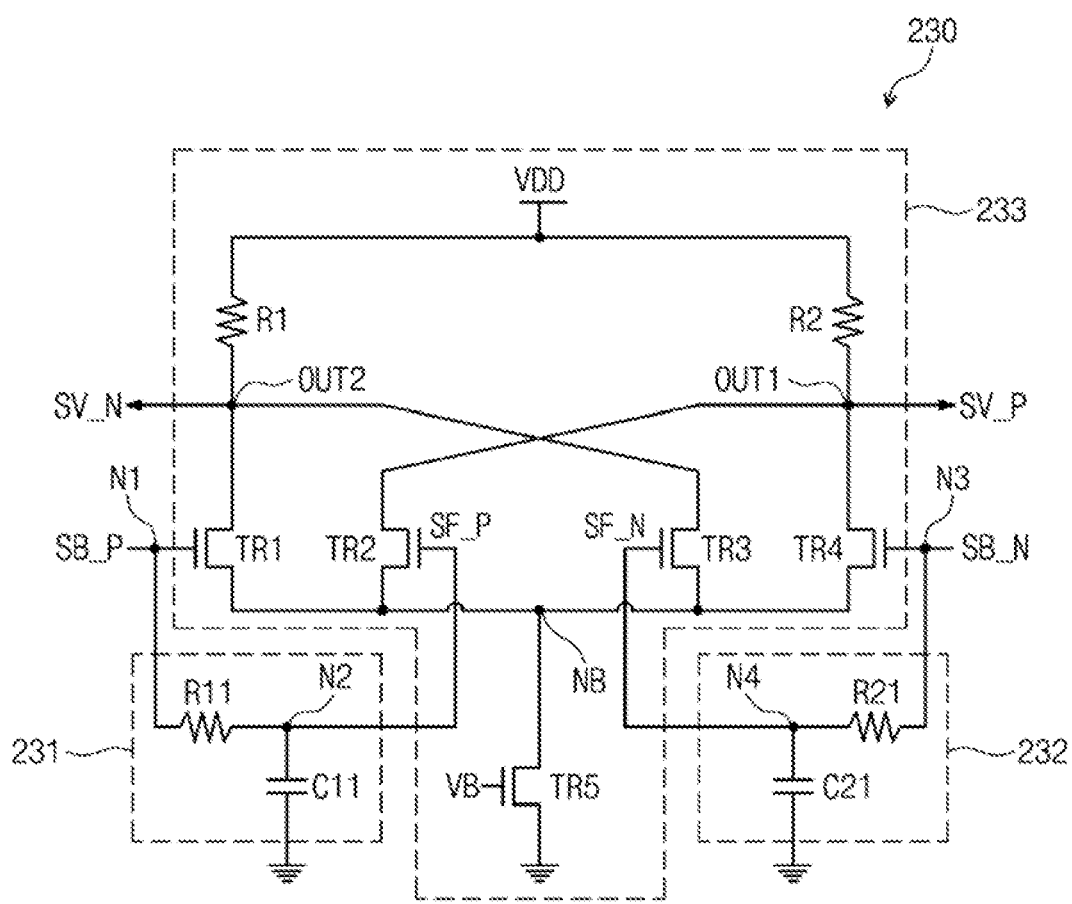
FIG. 5 is a circuit diagram showing a configuration of a balance compensation circuit according to an exemplary embodiment of the present disclosure.

FIG. 5 is a circuit diagram showing an example configuration of the balance compensation circuit 230 according to an exemplary embodiment of the present disclosure. Balance compensation circuit 230 may include a first filter circuit 231, a second filter circuit 232, and an amplifier 233.

The first filter circuit 231 removes a high-frequency component of the first biased signal SB_P to output a first filtered signal SF_P. The first filter circuit 231 is operated as a low pass filter. The first filter circuit 231 includes a first filter resistor R11 connected between a first node N1 and a second node N2 and a first filter capacitor C11 connected between the second node N2 and a reference ground.

The second filter circuit 232 outputs a second filtered signal SF_N obtained by removing a low-frequency component from the second biased signal SB_N. The second filter circuit 232 is operated as a low pass filter. The second filter circuit 232 includes a second filter resistor R21 connected between a third node N3 and a fourth node N4 and a second filter capacitor C21 connected between the fourth node N4 and the reference ground.

The amplifier 233 receives the first biased signal SB_P and the second filtered signal SF_N, where these signals are collectively referred to as a "first input signal" of amplifier 233 for reasons explained below. Amplifier 233 further receives the second biased signal SB_N and the first filtered signal SF_P, and these signals are collectively referred to as a "second input signal". Amplifier 233 outputs the first differential signal SV_P and the second differential signal SV_N, which are devoid of the offset voltages Vos and −Vos due to filtering and transistor operations, as will be explained. The amplifier 233 includes first and second resistors R1 and R2 and first, second, third, fourth, and fifth transistors TR1, TR2, TR3, TR4, and TR5.

The first resistor R1 is connected between a source voltage VDD terminal and a second output terminal OUT2. The second resistor R2 is connected between the source voltage VDD terminal and a first output terminal OUT1. The first transistor TR1 includes a first electrode connected to the second output terminal OUT2, a second electrode connected to a bias node NB, and a gate electrode receiving the first biased signal SB_P. (Herein, any "first electrode" or "second electrode" of a transistor, other than a gate electrode, may be a source or drain electrode of a field effect transistor.) The second transistor TR2 includes a first electrode connected to the first output terminal OUT1, a second electrode connected to the bias node NB, and a gate electrode receiving the first filtered signal SF_P of the second node N2, The third transistor TR3 includes a first electrode connected to the second output terminal OUT2, a second electrode connected to the bias node NB, and a gate electrode receiving the second filtered signal SF_N of the fourth node N4. The fourth transistor TR4 includes a first electrode connected to the first output terminal OUT1, a second electrode connected to the bias node NB, and a gate electrode receiving the second biased signal SB_N. The fifth transistor IRS includes a first electrode connected to the bias node NB, a second electrode connected to the reference ground, and a gate electrode receiving a bias signal VB.

Figure 6:
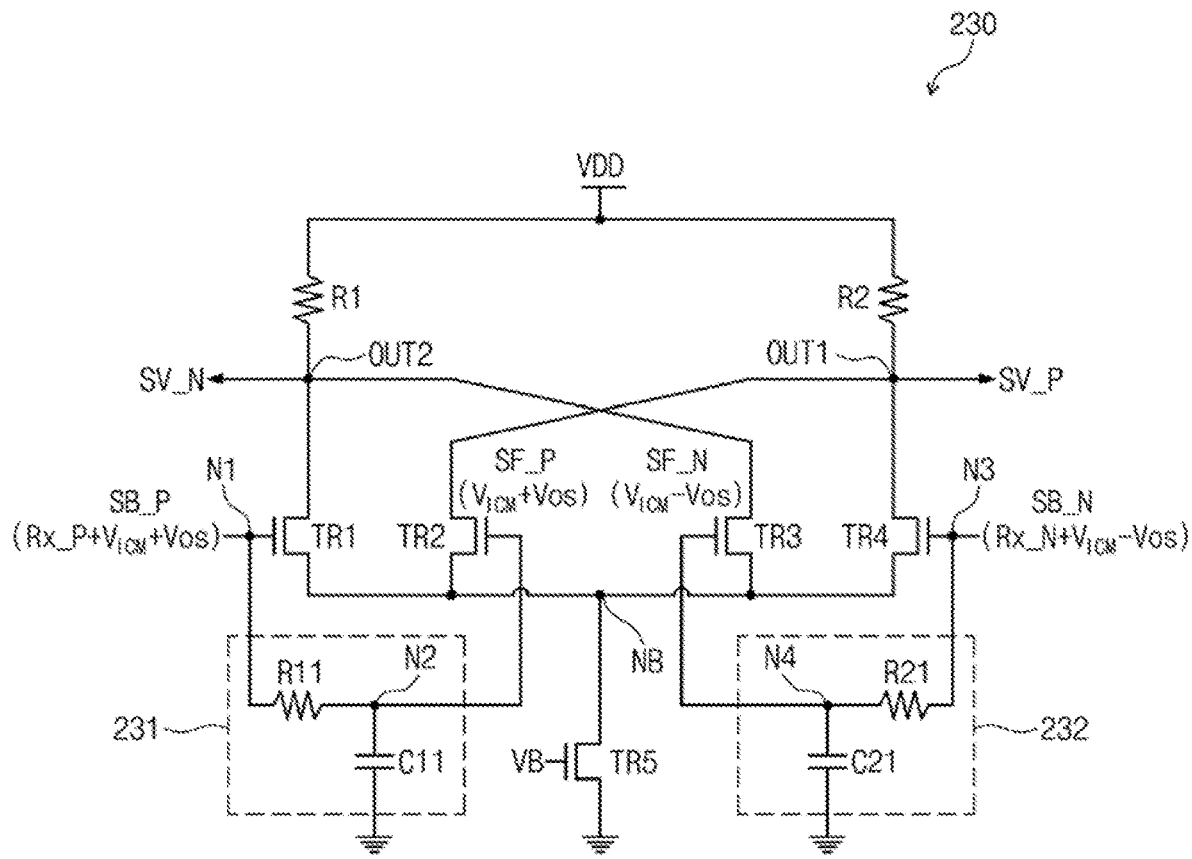
FIG. 6 is a circuit diagram explaining an operation of the balance compensation circuit according to an exemplary embodiment of the present disclosure.
Figure 7:
FIG. 7 is a signal diagram showing input signals of the balance compensation circuit according to an exemplary embodiment of the present disclosure.
Figure 7:
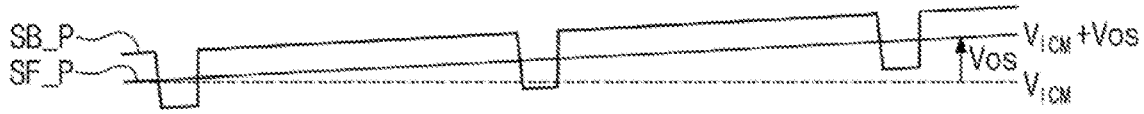
Figure 7:
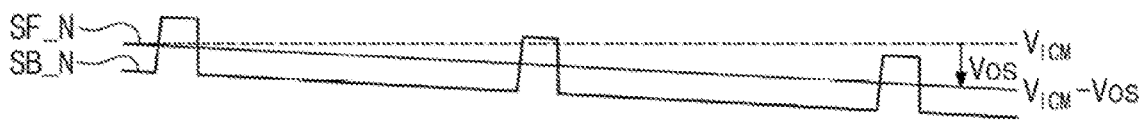

FIG. 6 is a circuit diagram explaining an operation of the example balance compensation circuit 230 according to an exemplary embodiment of the present disclosure. FIG. 7 is a signal diagram showing input signals of the balance compensation circuit according to an exemplary embodiment of the present disclosure. In the following discussion, "Rx_P" and "RX_N" will be used to refer to either the positive and negative differential signals themselves, or the voltage levels of these signals, depending on the context.

Referring to FIGS. 6 and 7, the first biased signal SB_P output from the first bias control circuit 210 shown in FIG. 4 has a voltage level equaling the voltage level of the first received signal Rx_P, the common mode voltage $V_{ICM}$, and the offset voltage Vos (i.e., the first biased signal SB_P=Rx_P+$V_{ICM}$+Vos). The second biased signal SB_N output from the second bias control circuit 220 has a voltage level obtained by subtracting the voltage level of the offset voltage Vos from a sum of the voltage level of the second received signal Rx_N and the voltage level of the common mode voltage $V_{ICM}$ (i.e., the second biased signal SB_N=Rx_N+$V_{ICM}$−Vos).

As described above, the common mode voltage $V_{ICM}$ corresponds to a voltage increased by the DC bias voltage by the first bias control circuit 210, and the offset voltage Vos indicates a voltage level deviation of the common mode voltage $V_{ICM}$ in accordance with variations in the characteristic impedance of the signal path 105 and the first and second capacitors C1 and C2 (which in turn may depend on the pattern of 1's and 0's in the transmission signal Tx_S as described earlier).

The first filter circuit 231 outputs the first filtered signal SF_P corresponding to a signal (i.e., $V_{ICM}$+Vos) obtained by removing the first received signal Rx_P, which is the high-frequency component, from the first biased signal SB_P, i.e., Rx_P+$V_{ICM}$+Vos.

The second filter circuit 232 outputs the second filtered signal SF_N corresponding to a signal (i.e., $V_{ICM}$−Vos) obtained by removing the second received signal Rx_N, which is the high-frequency component, from the second biased signal SB_N, i.e., Rx_N+V_−Vos.

The second output terminal OUT2 is commonly connected to the first electrode of the first transistor TR1 and the first electrode of the third transistor TR3. The first output terminal OUT1 is commonly connected to the first electrode of the fourth transistor TR4 and the first electrode of the second transistor TR2.

Accordingly, the amplifier 230 receives the first biased signal SB_P, i.e., Rx_P+$V_{ICM}$+Vos, and the second filtered signal SF_N, i.e., $V_{ICM}$−Vos as the first input signal and receives the second biased signal SB_N, i.e., Rx_N+$V_{ICM}$+Vos, and the first filtered signal SF_P, i.e., $V_{ICM}$+Vos as the second input signal.

The offset voltage +Vos included in the first biased signal SB_P and the offset voltage −Vos included in the second filtered signal SF_N are offset with respect to each other. Likewise, the offset voltage −Vos included in the second biased signal SB_N and the offset voltage +Vos included in the first filtered signal SF_P are offset with respect to each other.

Therefore, the amplifier 233 may output the first differential signal SV_P and the second differential signal SV_N corresponding to a difference between the first received signal Rx_P included in the first biased signal SB_P and the second received signal Rx_N included in the second biased signal SB_N. The first differential signal SV_P and the second differential signal SV_N output from the amplifier 233 do not include the offset voltage +Vos or the offset voltage −Vos.

Accordingly, the clock and data recovery circuit 240 shown in FIG. 4 may stably recover the clock signal CLK and the data signal DAIA based on the first differential signal SV_P and the second differential signal SV_N.

Figure 8:
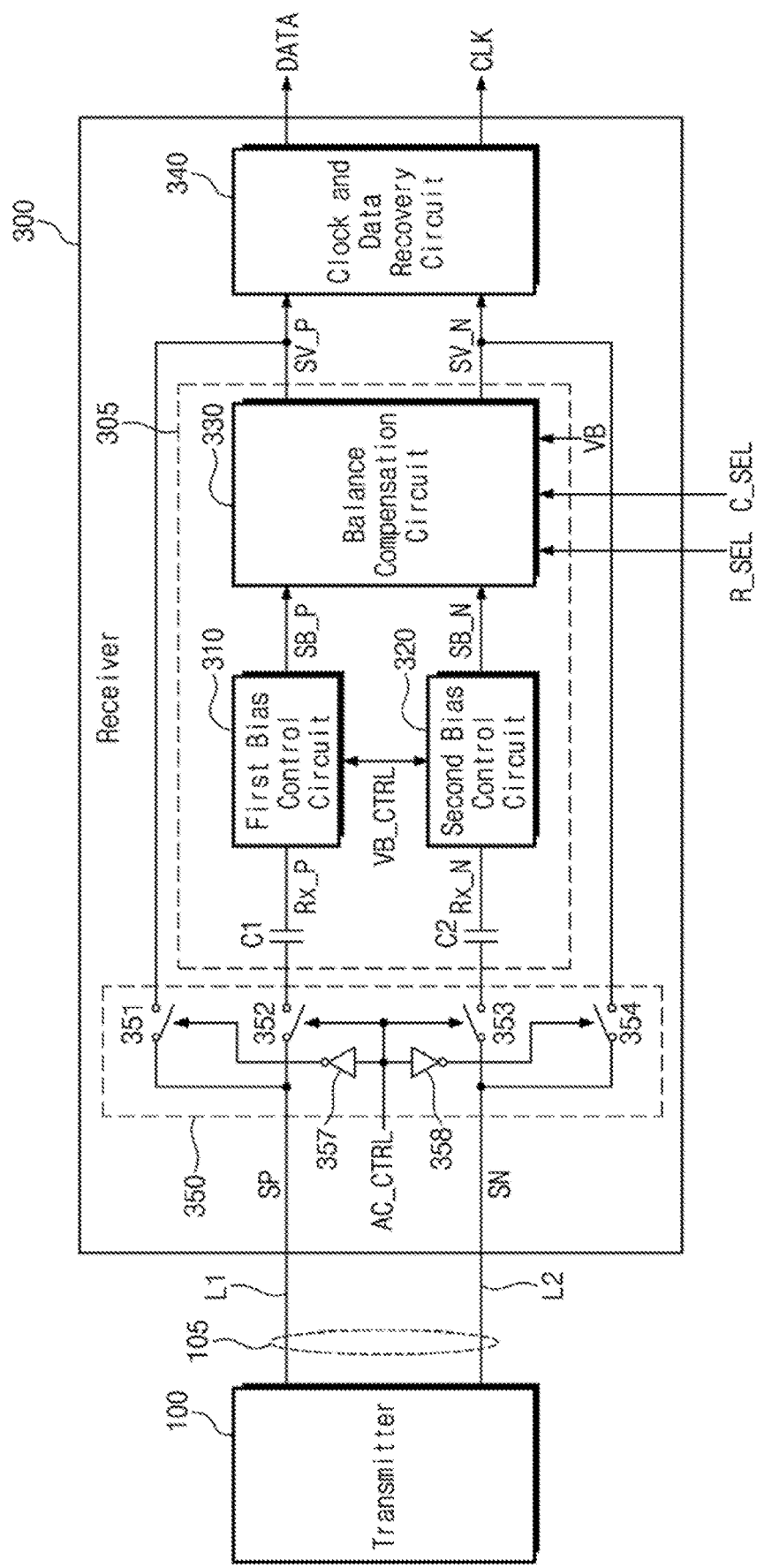
FIG. 8 is a block diagram showing a configuration of a receiver according to an exemplary embodiment of the present disclosure.

FIG. 8 is a block diagram showing a configuration of a receiver, 300, according to an exemplary embodiment of the present disclosure. Receiver 300 includes a receiving circuit 305, a clock and data recovery circuit 340, and a coupling selection circuit 350. The receiving circuit 305 includes a first capacitor C1, a second capacitor C2, a first bias control circuit 310, a second bias control circuit 320, and a balance compensation circuit 330. In this embodiment, receiving circuit 305 may compensate for voltage offsets in a similar manner as described above for receiver 200 (but with additional variability discussed below). Coupling selection 350 may effectively act as a bypass mechanism to bypass the compensation circuitry of receiving circuit 305 when voltage offset compensation is unnecessary.

The coupling selection circuit 350 applies a first signal SP and a second signal SN, which are received respectively through a first signal line L1 and a second signal line L2 of a signal path 105, to either the receiving circuit 305 or the clock and data recovery circuit 340 in response to a coupling control signal AC_CTRL. For example, when the coupling control signal AC_CTRL has a first level, e.g., a high level, the coupling selection circuit 350 applies the first signal SP and the second signal SN to the receiving circuit 305. When the coupling control signal AC_CTRL has a second level, e.g., a low level, the coupling selection circuit 350 applies the first signal SP and the second signal SN to the clock and data recovery circuit 340 as a first differential signal SV_P and a second differential signal SV_N.

The coupling selection circuit 350 includes switches 351, 352, 353, and 354 and inverters 357 and 358. The switches 352 and 353 electrically connect the first signal line L1 and the second signal line L2 to the receiving circuit 305 in response to the coupling control signal AC_CTRL. Likewise, the switches 351 and 354 electrically connect the first signal line L1 and the second signal line L2 to the clock and data recovery circuit 340 in response to signals output from the inverters 357 and 358. The signals output from the inverters 357 and 358 are complementary signals to the coupling control signal AC_CTRL.

When the coupling control signal AC_CTRL has the first level, the switches 352 and 353 are turned on, and an AC coupling operation may be performed by the first capacitor C1 and the second capacitor C2 of the receiving circuit 305. Accordingly, although a common mode voltage $V_{ICM}$ of the transmitter 100 is different from a common mode voltage $V_{ICM}$ set in the clock and data recovery circuit 340, the first differential signal SV_P and the second differential signal SV_N, in which the common mode voltage $V_{ICM}$ is controlled with voltage offsets compensated by the receiving circuit 305, may be applied to the clock and data recovery circuit 340.

When the coupling control signal AC_CTRL has the second level, the switches 351 and 354 are turned on, and a DC coupling operation, in which the first signal SP and the second signal SN are transmitted as the first differential signal SV_P and the second differential signal SV_N, may be performed. When the common mode voltage $V_{ICM}$ of the transmitter 100 is the same as the common mode voltage $V_{ICM}$ set in the clock and data recovery circuit 340, the operation of the receiving circuit 305 is not necessary, and therefore the receiving circuit 350 is bypassed.

First and second bias control circuits 310, 320 may have similar functionality as first and bias control circuits 210, 220 discussed above, but with an additional control mechanism through a bias control signal VB_CNTRL to control DC bias levels. To this end, the first bias control circuit 310 of the receiving circuit 305 outputs a first biased signal SB_P obtained by increasing a voltage level of a first received signal Rx_P provided through the first capacitor C1 by a predetermined DC bias voltage in response to a bias control signal VB_CTRL.

The second bias control circuit 320 outputs a second biased signal SB_N obtained by increasing a voltage level of a second received signal Rx_N provided through the second capacitor C2 by a predetermined DC bias voltage.

The DC bias voltage of each of the first bias control circuit 310 and the second bias control circuit 320 may be determined based on the bias control signal YB_CTRL. For instance, when the common mode voltage $V_{ICM}$ set in the clock and data recovery circuit 340 is about 0.6 volts, the bias control signal VB_CTRL may be a signal used to set the DC bias voltage to about 0.6 volts.

The balance compensation circuit 330 receives the first biased signal SB_P and the second biased signal SB_N and outputs the first differential signal SV_P and the second differential signal SV_N in response to a resistance selection signal R_SEL and a capacitance selection signal C_SEL.

Figure 9:
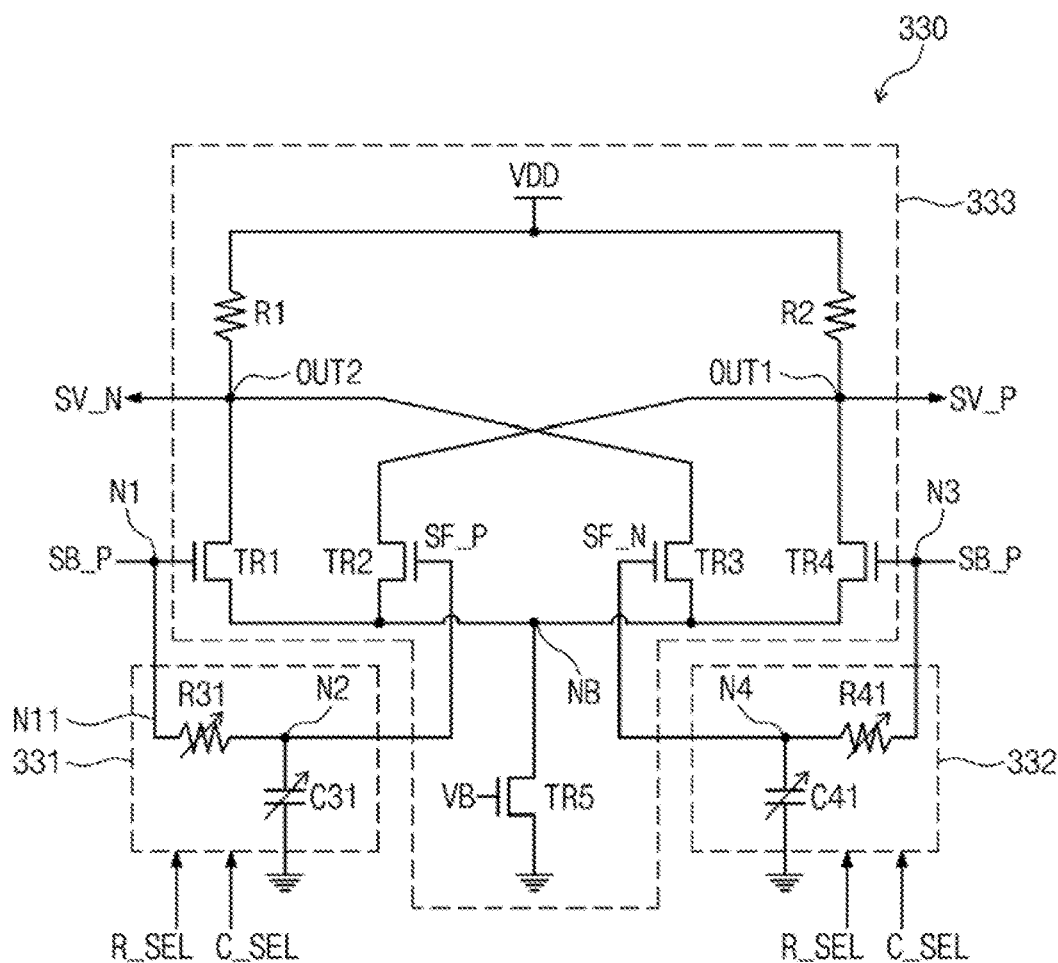
FIG. 9 is a circuit diagram showing a configuration of a balance compensation circuit according to an exemplary embodiment of the present disclosure.

FIG. 9 is a circuit diagram showing an example configuration of the balance compensation circuit 330 according to an exemplary embodiment of the present disclosure. The example balance compensation circuit 330 includes a first filter circuit 331, a second filter circuit 332, and an amplifier 333, where first and second filter circuits 331, 332 differ from those described above in connection with FIG. 6 by including variability for the capacitors and resistors, allowing for selective and dynamic filtering characteristics.

The first filter circuit 331 removes a high-frequency component from the first biased signal SB_P to output a first filtered signal SF_P. The first filter circuit 331 includes a first variable resistor R31 connected between a first node N1 and a second node N2 and a first variable capacitor C31 connected between the second node N2 and a reference ground. Each of the first variable capacitor C31 and the second variable capacitor discussed below may be implemented by a varactor or a series of capacitors and switches, where the switches selectively include or exclude capacitors to achieve capacitance variability. The first variable resistor R31 has a resistance determined by the resistance selection signal R_SEL. The first variable capacitor C31 has a capacitance determined by the capacitance selection signal C_SEL.

The second filter circuit 332 removes a high-frequency component from the second biased signal SB_N to output a second filtered signal SF_N. The second filter circuit 332 includes a second variable resistor R41 connected between a third node N3 and a fourth node N4 and a second variable capacitor C41 connected between the fourth node N4 and the reference ground. The second variable resistor R41 has a resistance determined by the resistance selection signal R_SEL. The second variable capacitor C41 has a capacitance determined by the capacitance selection signal C_SEL.

The amplifier 333 receives the first biased signal SB_P and the second filtered signal SF_N collectively as a first input signal, receives the second biased signal SB_N and the first filtered signal SF_P collectively as a second input signal, and outputs the first differential signal SV_P and the second differential signal SV_N based on the first and second input signals. The amplifier 333 includes first and second resistors R1 and R2 and first, second, third, fourth, and fifth transistors TR1, TR2, TR3, TR4, and TR5.

Figure 10:
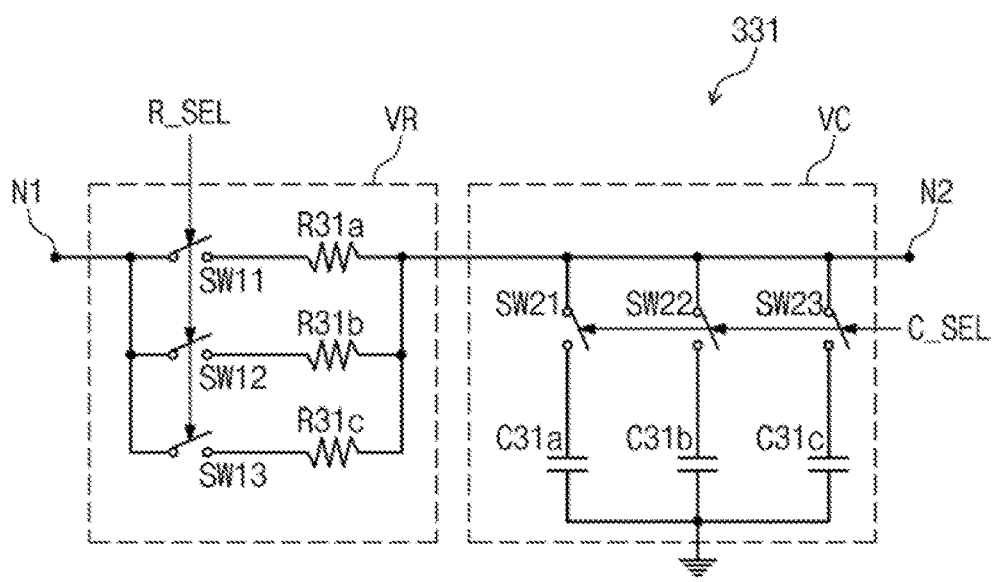
FIG. 10 is a circuit diagram showing a configuration of a filter circuit according to an exemplary embodiment of the present disclosure.

FIG. 10 is a circuit diagram showing an example configuration of the first filter circuit 331 according to an exemplary embodiment of the present disclosure. The example first filter circuit 331 includes variable resistor circuit VR connected between the first node N1 and the second node N2 and a variable capacitor circuit VC connected between the second node N2 and the reference ground. FIG. 10 shows only the first filter circuit 331; however, the second filter circuit 332 shown in FIG. 9 may have a similar configuration as that of the first filter circuit 331.

The variable resistor circuit VR includes switches SW11, SW12, and SW13 and resistors R31a, R31b, and R31c. The variable capacitor circuit VC includes switches SW21, SW22, and SW23 and capacitors C31a, C31b, and C31c. According to the exemplary embodiment shown in FIG. 10, the variable resistor circuit VR includes three resistors, and the variable capacitor circuit VC includes three capacitors; however, any suitable number of resistors and capacitors may be utilized.

The switches SW11 to SW13 connect first ends of the resistors R31a to R31c to the first node N1 in response to the resistance selection signal R_SEL; opposite, second ends of the resistors are connected to the second node N2. At least one of the switches SW11 to SW13 is turned on in response to the resistance selection signal R_SEL. The resistors R31a to R31c may have different resistances from each other or may have the same resistances. The variable resistor circuit VR may have a resistance determined depending on the number of the resistors connected between the first node N1 and the second node N2 and the resistance of the resistors.

The switches SW21 to SW23 connect first ends of the capacitors C31a to C31c to the second node N2 in response to the capacitance selection signal C_SEL, where opposite, second ends of the capacitors are connected to the node N2. At least one of the switches SW21 to SW23 is turned on in response to the capacitance selection signal C_SEL. The capacitors C31a to C31c may have different capacitances from each other or the same capacitance as each other. The variable capacitor circuit VC may have a capacitance determined based on the number of the capacitors connected between the second node N2 and the reference ground and the capacitance of the capacitors. The resistance of the variable resistor circuit VR and the capacitance of the variable capacitor circuit VC are set to values appropriate to remove the high-frequency components of the first biased signal SB_P.

It is noted here that an alternative embodiment of a receiver may be a hybrid of elements of receivers 200 and 300. For instance, another embodiment of a receiver may include all the elements of the receiver 300, but with the receiving circuit 305 substituted with the receiver 200 of FIG. 4. This would result in a receiver with the bypass capability due to coupling selection circuit 350, but without the extra control afforded by the signals VB_CNTRL, R_SEL and C_SEL. As another example, the receiver 300 may be modified by omitting the variability afforded by the VB_CNTRL signal, but maintaining the variability afforded by the R_SEL and C_SEL signals, or vice versa.

Figure 11:
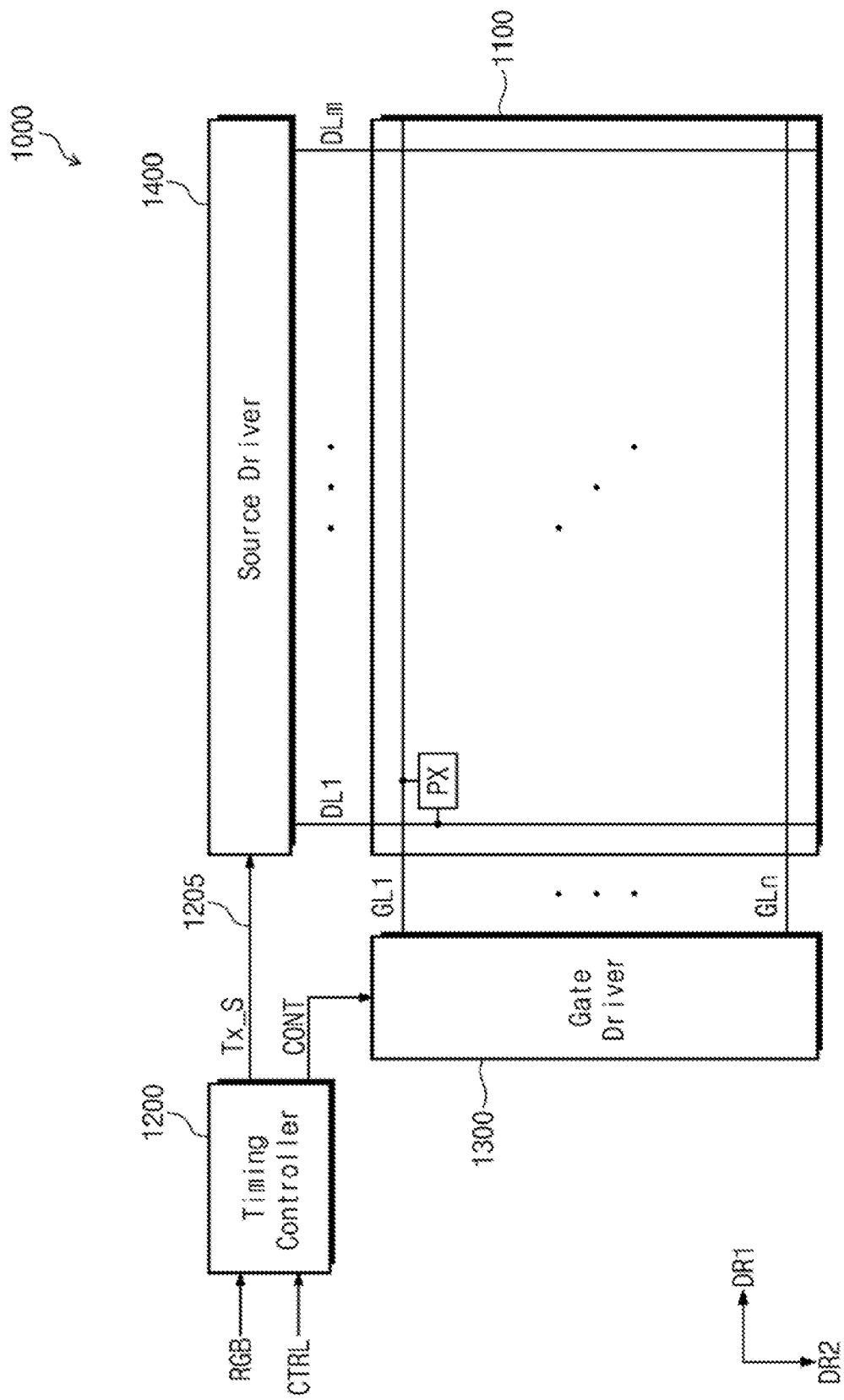
FIG. 11 is a block diagram showing a display device according to an exemplary embodiment of the present disclosure.

FIG. 11 is a block diagram showing a display device 1000 according to an exemplary embodiment of the present disclosure. The display device 1000 includes a display panel 1100, a timing controller 1200, a gate driver 1300, and a source driver 1400.

The display panel 1100 includes a plurality of gate lines GL1 to GLn extending in a first direction DR1, a plurality of data lines DL1 to DLm extending in a second direction DR2, and a plurality of pixels PX arranged in areas defined by the gate lines GL1 to GLn and the data lines DL1 to DLm crossing the gate lines GL1 to GLn. The data lines DL1 to DLm are insulated from the gate lines GL1 to GLn.

The timing controller 1200 receives image signals RGB and control signals CTRL from an external source (not shown). The control signals CTRL include, for example, a vertical synchronization signal, a horizontal synchronization signal, a main clock signal, a data enable signal, and the like. The timing controller 1200 controls the gate driver 1300 and the source driver 1400 based on the control signals.

The timing controller 1200 applies the transmission signal Tx_S to the source driver 1400. The timing controller 1200 processes the image signals RGB by taking into account an operation condition of the display panel 1100 to generate an image data signal and a clock signal. The generated image data signal and the dock signal are applied to the source driver 1400 as the transmission signal Tx_S. The timing controller 1200 applies a gate control signal CONT to the gate driver 1300. The gate control signal CONT includes a vertical synchronization start signal, an output enable signal, and a gate clock signal.

The gate driver 1300 drives the gate lines GL1 to GLn in response to the gate control signal CONT from the timing controller 1200. The gate driver 1300 includes a gate driver integrated circuit. According to another embodiment, the gate driver 1300 may be implemented in a circuit using oxide semiconductor, amorphous semiconductor, crystalline semiconductor, polycrystalline semiconductor, and the like and formed in a predetermined area of the display panel 1100. In this case, the gate driver 1300 may be substantially simultaneously formed with the pixels PX through a thin film process.

Figure 12:
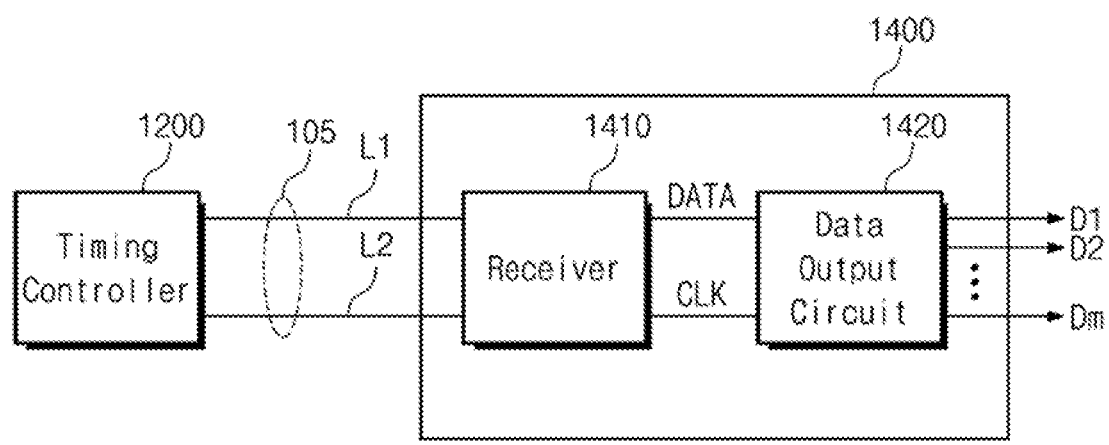
FIG. 12 is a block diagram showing a source driver according to an exemplary embodiment of the present disclosure.

The source driver 1400 receives the transmission signal Tx_S from the timing controller 1200 through a signal path 1205 and drives the data lines DL1 to DLm. The source driver 1400 may include the receiver 200 of FIG. 4 or the receiver 300 of FIG. 8. FIG. 12 is a block diagram depicting an example of the source driver 1400 according to an exemplary embodiment of the present disclosure. Source driver 1400 includes a receiver 1410 and a data output circuit 1420. The receiver 1410 receives the transmission signal Tx_S through a first signal line L1 and a second signal line L2 of the signal path 1205 and recovers a data signal DATA and a clock signal CLK. The receiver 1410 has substantially the same circuit configuration as the receiver 200 of FIG. 4. According to another embodiment, the receiver 1410 may have substantially the same circuit configuration as the receiver 300 of FIG. 8.

The data output circuit 1420 outputs data driving signals D1 to Dm based on the data signal DATA and the clock signal CLK. The data driving signals D1 to Dm are respectively applied to the data lines DL1 to DLm shown in FIG. 11.

Figure 13:
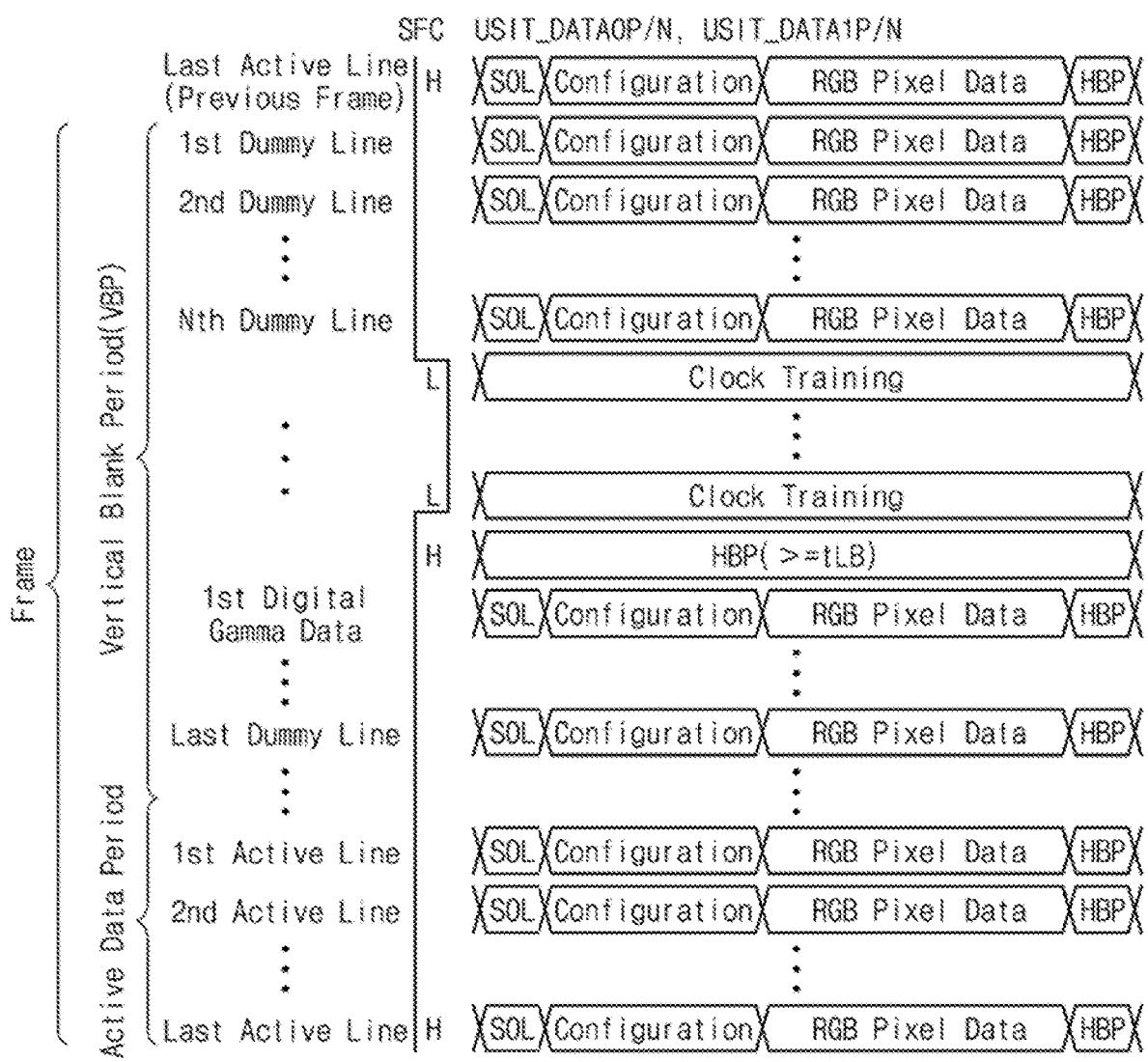
FIG. 13 is a signal/timing diagram showing signals transmitted to a source driver from a timing controller.

FIG. 13 is a signal/timing diagram showing example signals transmitted to the source driver 1400 from the timing controller 1200 in one frame. In addition to receiving the transmission signal Tx_S as described above, the source driver 1400 may further receive a state information signal SFC from the timing controller 1200. The source driver 1400 recovers the image data signal DATA based on the transmission signal Tx_S during an active period in which the state information signal SFC has a high level (SOL, Configuration, RGB Pixel Data, and HBP (Horizontal Blank Period) data are received during this time). Source driver 1400 recovers the clock signal CLK based on the transmission signal Tx_S during a vertical blank period in Which the state information signal SFC has a low level ("Clock Training" portion of the frame).

The coupling control signal AC_CTRL, the bias control signal VB_CTRL, the resistance selection signal R_SEL, and the capacitance selection signal C_SEL, described earlier with reference to FIG. 8, may be included in the Configuration information among the transmission signal Tx_S of the one frame. According to another embodiment, the coupling control signal AC_CTRL, the bias control signal VB_CTRL, the resistance selection signal R_SEL, and the capacitance selection signal C_SEL may be directly applied to the source driver 1400 from a source outside the source driver 1400.

Figure 14:
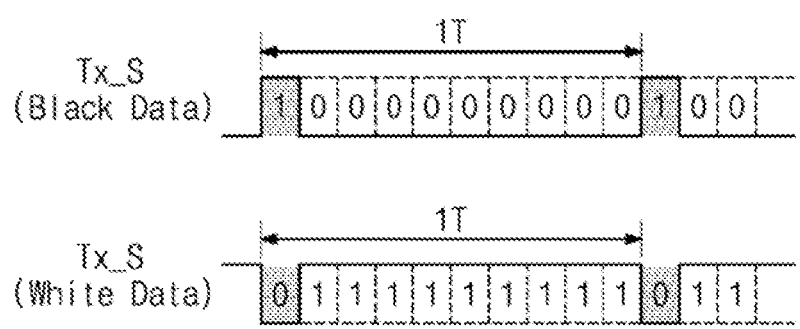
FIG. 14 is a signal diagram showing a signal transmitted from the timing controller.

FIG. 14 is a signal diagram showing an example signal transmitted from the timing controller 1200. When the image data signal included in the transmission signal Tx_S corresponds to a black image, 1-pixel data 1T (a bit sequence comprising one pixel's worth of data) includes a "super majority" of low-level signals (i.e., logic '0'). In the example of FIG. 14, the super majority is 90%, since 9 out of 10 of the bits are logic zero, due to a one bit logic '1' header and a sequence of nine consecutive 0's in a 1-pixel data set. Meanwhile, in a case that the image data signal included in the transmission signal Tx_S corresponds to a white image, the 1-pixel data 1T include a super majority of high-level signals (i.e., logic '1'). As described above, the low-level signals (i.e., logic '0') or the high-level signals (i.e., logic '1') are a super majority of low-level or high-level signals in the 1-pixel data 1T, causing the characteristic impedance of the signal path 1205 to be changed by the first capacitor C1 and the second capacitor C2, and thus the common mode voltage $V_{ICM}$ rises or falls by the offset voltage Vos during the time interval that the 1-pixel data 1T is transmitted by the timing controller 1200.

The receiver 1410 recovers the data signal DATA and the clock signal CLK based on the first differential signal SV_P and the second differential signal SV_N, each for which the offset voltage Vos is compensated. Accordingly, although the common mode voltage $V_{ICM}$ of the timing controller 1200 is set different from the common mode voltage $V_{ICM}$ of the source driver 1400, the source driver 1400 may stably recover the data signal DATA and the clock signal CLK from the transmission signal Tx_S received from the timing controller 1200.

In the above embodiments, a receiver (e.g. 200, 300) (interchangeably, "receiving circuit") with balance compensation circuitry to compensate for common mode voltage differential due to offset voltages, has been described mainly in the context of a receiver of a source driver in a display device. However, the receiver may be utilized for other types of data, and in any serial data communication application in which it is desirable to achieve such balance compensation and reduce a hit error rate or the like. For instance, in other data communication applications, whenever a predetermined hit sequence size has a super majority of 1's or 0's, voltage offset may be produced and cause hit errors on receive (receiver malfunction) in a similar manner as described in connection with FIG. 3. Thus, a dynamic offset voltage compensation may be implemented in the receiver for these other applications, in accordance with the above described circuitry and control for a display device in a similar manner to obviate such errors.

Although exemplary embodiments of the inventive concept have been described, it is understood that the inventive concept is not limited to these exemplary embodiments, but various changes and modifications can be made by one ordinary skilled in the art within the spirit and scope of the inventive concept as hereinafter claimed.

What is claimed is:

1. A receiving circuit comprising:
   a first capacitor connected to a first signal line;
   a second capacitor connected to a second signal line;
   a first bias control circuit configured to convert a common mode voltage of a first received signal provided through the first capacitor to a first voltage level to output therefrom a first biased signal;
   a second bias control circuit configured to convert a common mode voltage of a second received signal provided through the second capacitor to a second voltage level to output therefrom a second biased signal; and
   a balance compensation circuit configured to receive the first biased signal and the second biased signal compensate for an offset voltage of the first biased signal based on the second biased signal, and compensate for an offset voltage of the second biased signal based on the first biased signal to output therefrom a first differential signal and a second differential signal.

2. The receiving circuit of claim 1, wherein the balance compensation circuit comprises:
   a first filter circuit for removing a high-frequency component from the first biased signal to output therefrom a first filtered signal;
   a second filter circuit for removing a high-frequency component from the second biased signal to output therefrom a second filtered signal; and
   an amplifier for receiving the first biased signal and the second filtered signal as a first input signal, receiving the second biased signal and the first filtered signal as a second input signal, and generating therefrom the first differential signal and the second differential signal.

3. The receiving circuit of claim 2, wherein the amplifier comprises:
   a first resistor connected between a source voltage and a second output terminal;
   a second resistor connected between the source voltage and a first output terminal;

a first transistor comprising a first electrode connected to the second output terminal, a second electrode connected to a bias node, and a gate electrode receiving the first biased signal;

a second transistor comprising a first electrode connected to the first output terminal, a second electrode connected to the bias node, and a gate electrode receiving the first filtered signal;

a third transistor comprising a first electrode connected to the second output terminal, a second electrode connected to the bias node, and a gate electrode receiving the second filtered signal;

a fourth transistor comprising a first electrode connected to the first output terminal, a second electrode connected to the bias node, and a gate electrode receiving the second biased signal; and a fifth transistor comprising a first electrode connected to the bias node, a second electrode connected to a reference ground, and a gate electrode receiving a bias signal.

4. The receiving circuit of claim 2, wherein each of the first filter circuit and the second filter circuit comprises a low pass filter.

5. The receiving circuit of claim 2, wherein the first filter circuit comprises:
a first filter resistor connected between a first node receiving the first biased signal and a second node; and
a first filter capacitor connected between the second node and a reference ground.

6. The receiving circuit of claim 2, wherein each of the first filter circuit and the second filter circuit changes an operation characteristic thereof in response to a resistance selection signal and a capacitance selection signal.

7. The receiving circuit of claim 6, wherein the first filter circuit comprises:
a plurality of filtering resistors having different resistances from each other;
a plurality of capacitors having different capacitances from each other;
a first switching circuit connecting one filtering resistor among the filtering resistors between a first node receiving the first biased signal and a second node in response to the resistance selection signal; and
a second switching circuit connecting one capacitor among the capacitors between the second node and a reference ground in response to the capacitance selection signal.

8. The receiving circuit of claim 1, wherein the first bias control circuit selects the first voltage level in response to a bias control signal, and the second bias control circuit selects the second voltage level in response to the bias control signal.

9. The receiving circuit of claim 1, wherein the first voltage level is substantially the same as the second voltage level.

10. The receiving circuit of claim 1, further comprising a clock and data recovery circuit to recover a clock signal and a data signal based on the first differential signal and the second differential signal.

11. A receiver comprising:
a receiving circuit configured to convert a first received signal and a second received signal to a first differential signal and a second differential signal, respectively;
a clock and data recovery circuit configured to recover a clock signal and a data signal based on the first differential signal and the second differential signal; and a coupling selection circuit configured to apply a first signal and a second signal provided, respectively, through a first signal line and a second signal line, to the receiving circuit as the first received signal and second received signal, respectively, or to the clock and data recovery circuit as the first differential signal and the second differential signal, respectively, in response to a coupling control signal;

wherein the receiving circuit comprises:
a first capacitor connected to the first signal line through the coupling selection circuit;
a second capacitor connected to the second signal line through the coupling selection circuit;
a first bias control circuit configured to convert a common mode voltage of the first received signal provided through the first capacitor to a first voltage level to output therefrom a first biased signal;
a second bias control circuit configured to convert a common mode voltage of the second received signal provided through the second capacitor to a second voltage level to output therefrom a second biased signal; and
a balance compensation circuit configured to receive the first biased signal and the second biased signal, compensate for an offset voltage of the first biased signal using the second biased signal, and compensate for an offset voltage of the second biased signal using the first biased signal to output therefrom the first differential signal and the second differential signal.

12. The receiver of claim 11, wherein the coupling selection circuit comprises:
first and second switching elements respectively and selectively connecting the first signal line and the second signal line to the first capacitor and the second capacitor in response to the coupling control signal; and
third and fourth switching elements applying the first signal of the first signal line and the second signal of the second signal line to the clock and data recovery circuit as the first differential signal and the second differential signal in response to the coupling control signal.

13. The receiver of claim 11, wherein the balance compensation circuit comprises:
a first filter circuit removing a high-frequency component from the first biased signal to output a first filtered signal;
a second filter circuit removing a high-frequency component from the second biased signal to output a second filtered signal; and
an amplifier receiving the first biased signal and the second filtered as a first input signal, receiving the second biased signal and the first filtered signal as a second input signal, and outputting therefrom the first differential signal and the second differential signal.

14. The receiver of claim 13, wherein the amplifier comprises:
a first resistor connected between a source voltage and a second output terminal;
a second resistor connected between the source voltage and a first output terminal;
a first transistor comprising a first electrode connected to the second output terminal, a second electrode connected to a bias node, and a gate electrode receiving the first biased signal;

a second transistor comprising a first electrode connected to the first output terminal, a second electrode connected to the bias node, and a gate electrode receiving the first filtered signal;

a third transistor comprising a first electrode connected to the second output terminal, a second electrode connected to the bias node, and a gate electrode receiving the second filtered signal;

a fourth transistor comprising a first electrode connected to the first output terminal, a second electrode connected to the bias node, and a gate electrode receiving the second biased signal; and a fifth transistor comprising a first electrode connected to the bias node, a second electrode connected to a reference ground, and a gate electrode receiving a bias signal.

15. The receiver of claim 13, wherein the first filter circuit comprises:

a first filter resistor connected between a first node receiving the first biased signal and a second node; and a first filter capacitor connected between the second node and a reference ground.

16. A display device comprising:

a display panel comprising a plurality of gate lines, a plurality of data lines, and a plurality of pixels, each being connected to a corresponding gate line among the gate lines and a corresponding data line among the data lines;

a gate driver configured to drive the gate lines;

a source driver configured to drive the data lines; and a timing controller configured to control the gate driver and the source driver in response to a control signal and an image input signal provided from an outside source thereof, convert the input image signal to first and second transmission signals, and transmit the first and second transmission signals to the source driver through first and second signal lines;

wherein the source driver comprises:

a first capacitor connected to the first signal line;

a second capacitor connected to the second signal line;

a first bias control circuit configured to convert a common mode voltage of a first received signal provided through the first capacitor to a first voltage level to output therefrom a first biased signal;

a second bias control circuit configured to convert a common mode voltage of a second received signal provided through the second capacitor to a second voltage level to output therefrom a second biased signal; and a balance compensation circuit configured to receive the first biased signal and the second biased signal, compensate for an offset voltage of the first biased signal using the second biased signal, and compensate for an offset voltage of the second biased signal using the first biased signal to output therefrom a first differential signal and a second differential signal.

17. The display device of claim 16, wherein the balance compensation circuit comprises:

a first filter circuit removing a high-frequency component from the first biased signal to output a first filtered signal;

a second filter circuit removing a high-frequency component from the second biased signal to output a second filtered signal; and an amplifier receiving the first biased signal and the second filtered signal as a first input signal, receiving the second biased signal and the first filtered signal as a second input signal, and outputting therefrom the first differential signal and the second differential signal.

18. The display device of claim 17, wherein the amplifier comprises:

a first resistor connected between a source voltage and a second output terminal;

a second resistor connected between the source voltage and a first output terminal;

a first transistor comprising a first electrode connected to the second output terminal, a second electrode connected to a bias node, and a gate electrode receiving the first biased signal;

a second transistor comprising a first electrode connected to the first output terminal, a second electrode connected to the bias node, and a gate electrode receiving the first filtered signal;

a third transistor comprising a first electrode connected to the second output terminal, a second electrode connected to the bias node, and a gate electrode receiving the second filtered signal;

a fourth transistor comprising a first electrode connected to the first output terminal, a second electrode connected to the bias node, and a gate electrode receiving the second biased signal; and a fifth transistor comprising a first electrode connected to the bias node, a second electrode connected to a reference ground, and a gate electrode receiving a bias signal.

19. The display device of claim 16, wherein the source driver further comprises a clock and data recovery circuit to recover a clock signal and a data signal based on the first differential signal and the second differential signal.

20. The display device of claim 19, wherein the source driver applies the data signal to the data lines in synchronization with the clock signal.

* * * * *